(12) United States Patent
Dhindsa et al.

(10) Patent No.: US 7,758,764 B2
(45) Date of Patent: Jul. 20, 2010

(54) METHODS AND APPARATUS FOR SUBSTRATE PROCESSING

(75) Inventors: Rajinder Dhindsa, San Jose, CA (US); Alexei Marakhtanov, Albany, CA (US)

(73) Assignee: Lam Research Corporation, Fremont, CA (US)

( * ) Notice: Subject to any disclaimer, the term of this patent is extended or adjusted under 35 U.S.C. 154(b) by 581 days.

(21) Appl. No.: 11/770,637

(22) Filed: Jun. 28, 2007

(65) Prior Publication Data

US 2009/0071938 A1 Mar. 19, 2009

(51) Int. Cl.
*B44C 1/22* (2006.01)
*C03C 15/00* (2006.01)
*C03C 25/68* (2006.01)
*C23F 1/00* (2006.01)

(52) U.S. Cl. .................. 216/71; 216/67; 156/345.38; 118/723 MP

(58) Field of Classification Search .................. 216/71; 156/345.38, 345.51; 118/723 MP
See application file for complete search history.

(56) References Cited

U.S. PATENT DOCUMENTS

2002/0187647 A1 12/2002 Dhindsa et al.
2007/0032081 A1 2/2007 Chang et al.

OTHER PUBLICATIONS

"International Search Report", Issued in PCT Application No. PCT/US2008/067829; Mailing Date: Oct. 29, 2008.
"Written Opinion", Issued in PCT Application No. PCT/US2008/067829; Mailing Date: Oct. 29, 2008.
"International Preliminary Report on Patentability", Issued in PCT Application No. PCT/US2008/067829; Mailing Date: Jan. 14, 2010.

*Primary Examiner*—Roberts Culbert
(74) *Attorney, Agent, or Firm*—IP Strategy Group, P.C.

(57) ABSTRACT

A method for processing a substrate in a plasma processing chamber is provided. The substrate is disposed above a chuck and surrounded by an edge ring. The edge ring is electrically isolated from the chuck. The method includes providing first RF power to the chuck. The method also includes providing an edge ring RF voltage control arrangement. The edge ring RF voltage control arrangement is coupled to the edge ring to provide second RF power to the edge ring resulting in the edge ring having an edge ring potential. The method further includes generating a plasma within the plasma processing chamber to process the substrate. The substrate is being processed while the edge ring RF voltage control arrangement is configured to cause the edge ring potential to be substantially equal to a DC potential of the substrate while processing the substrate.

28 Claims, 6 Drawing Sheets

METHODS AND APPARATUS FOR SUBSTRATE PROCESSING

BACKGROUND OF THE INVENTION

Advances in plasma processing have facilitated growth in the semiconductor industry. Since the semiconductor industry is highly competitive, device manufacturers generally want to maximize yield and efficiently utilize the real estate available on a substrate. During plasma processing of the substrate, a plurality of parameters may need to be controlled to ensure high yield of devices being processed. A common cause of defective devices is the lack of uniformity during substrate processing. Factors that may affect uniformity are substrate edge effects. Another cause of defective devices may be due to polymeric by-products flaking off from the backside of one substrate onto another substrate during transport.

Due to the demand for higher performance devices, the pressure to further reduce substrate feature sizes, as well as the implementation of newer optimized substrate materials, has challenged current fabrication technologies. For example, it is becoming increasing difficult to maintain the uniformity or process results from the center to the edge of larger substrates (e.g., >300 mm). In general, for a given feature size, the number of devices on the substrate near the edge increases as the size of the substrate becomes larger. Likewise, for a given substrate size, the number of devices on the substrate near the edge increases as the feature size of the devices decreases. For example, often over 20% the total number of devices on a substrate are located near the perimeter the substrate.

Due to edge effects, such as electric field, plasma temperature, and the loading effects from process chemistry, the process results near the substrate edge may differ from the remaining (center) area of the substrate. For example, the equipotential lines of the plasma sheath may become disrupted, causing non-uniform ion angular distribution around the substrate edge. Generally, it is desirable for the electric field to remain substantially constant over the entire surface of the substrate in order to maintain process uniformity and vertical etch profiles.

In addition, during the etch process, it may be common for polymer byproducts (e.g., fluorinated polymers, etc.) to form on the substrate backside and/or around the substrate edge. Fluorinated polymers generally are comprised of photo resist material previously exposed to an etch chemistry, or polymer byproducts deposited during a fluorocarbon etch process. In general, a fluorinated polymer is a substance with a chemical equation of $C_xH_yF_z$, where x, z are integers greater than 0, and y is an integer greater than or equal to 0 (e.g., $CF_4$, $C_2F_6$, $CH_2F_2$, $C_4F_8$, $C_5F_8$, etc.).

However, as successive polymer layers are deposited on the edge area as the result of several different etch processes, organic bonds that are normally strong and adhesive will eventually weaken and peel or flake off, often onto another substrate during transport. For example, substrates are commonly moved in sets between plasma processing systems via substantially clean containers, often called cassettes. As a higher positioned substrate is repositioned in the container, a portion of a polymer layer may fall on a lower substrate where dies are present, potentially affecting device yield.

FIG. 1 shows a simplified diagram of a substrate in which a set of edge polymers have been deposited on the planar backside is shown. As previously stated, during the etch process, it may be common for polymer by-products (edge polymers) to form on the substrate. In this example, the polymer by-products have been deposited on the planar backside, that is, the side of the substrate away from the plasma. For example, the polymer thickness may be about 250 nm at about 70° (102), 270 nm at about 45° (104), and about 120 nm at 0° (106). In general, the greater the thickness of the polymer, the higher the probability that a portion of the polymer may become dislodged and fall onto another substrate or the chuck, potentially affecting manufacturing yield.

FIG. 2 shows a simplified diagram of a capacitively-coupled plasma processing system in which the DC potential of the edge ring is substantially greater than that of the substrate. In general, a source RF generated by source RF generator 210 is commonly used to generate the plasma as well as control the plasma density via capacitively coupling. Certain etch applications may require the upper electrode to be grounded with respect to a lower electrode, which is RF powered. The RF power is at least one of 2 MHz, 27 MHz, and 60 MHz. Still other etch applications may require both the upper electrode and the lower electrode to be RF powered using similar RF frequencies.

Generally, an appropriate set of gases is flowed through an inlet in an upper electrode 202. The gases are subsequently ionized to form plasma 204 in order to process (e.g., etch or deposit) exposed areas of substrate 206, such as a semiconductor substrate or a glass pane, positioned with a hot edge ring (HER) 212 (e.g., Si, etc.) on an electrostatic chuck (ESC) 208, which also serves as a powered electrode.

Hot edge ring 212 generally performs many functions, including positioning substrate 206 on ESC 208 and shielding the underlying components not protected by the substrate itself from being damaged by the ions of the plasma. Hot edge ring 212 may further sit on coupling ring 220 (e.g., quartz, etc.), which is generally configured to provide a current path from chuck 208 to hot edge ring 212. In general, a configurable DC power source 216 may be coupled to hot edge ring 212 through RF filter 214.

RF filter 214 is generally used to provide attenuation of unwanted RF power without introducing losses to DC power source 216. RF filter 214 includes a switch module that allows a positive or negative current polarity to be selected, as well as a path to ground. The RF filter 214 includes vacuum relays. RF harmonics are generated in the plasma discharge and may be kept from being returned to the DC power source by the RF filter.

In the case where DC power source 216 is a positive voltage, the DC potential of the edge ring is substantially higher than that of the substrate in a typical plasma process. Thus, the angular ion distribution profile is substantially non-uniform, with a set of vectors that tend to point toward areas of lower potential, such as the substrate edge. This application is highly useful for polymer removal from the substrate edge, as mentioned earlier.

In another case where DC power source 216 is a positive voltage, the DC potential of the edge ring may be substantially similar to that of the substrate (e.g., $V_{substrate} - V_{edge\ ring} \approx 0$). The DC potential on the substrate during processing tends to be negative with respect to ground, and thus when the edge ring is coupled to receive a negative potential (with respect to ground), the DC potential of the edge ring and the DC potential of the substrate are substantially equal. Consequently, angular ion distribution is substantially uniform, with a set of vectors that are substantially perpendicular to the substrate in an area of the plasma sheath above both the substrate and the edge ring. As previously stated, this perpendicular angular profile may be useful for anisotropic etch applications, such as etching contacts and trenches with high aspect ratios.

It is also possible to, for example, couple the ground terminal of the DC power source, in which case the edge ring may have a higher potential (being at ground) than the DC potential of the substrate (being generally negative during processing, in an embodiment). In this case, the angular ion distribution will also tend toward the substrate edge, albeit to a lesser degree than when the edge ring is coupled to receive voltage from the positive terminal of the DC power source.

However, aforementioned prior art methods employing DC control on hot edge ring may require substantial DC power to sustain the required voltages, adding cost to the fabrication of devices. In addition, arcing between the wafer edge and hot edge ring may cause pitting on substrate edge and damage to the devices, thereby reducing yield.

SUMMARY OF INVENTION

The invention relates, in an embodiment, to a method for processing a substrate in a plasma processing chamber. The substrate is disposed above a chuck and surrounded by an edge ring. The edge ring is electrically isolated from the chuck. The method includes providing first RF power to the chuck. The method also includes providing an edge ring RF voltage control arrangement. The edge ring RF voltage control arrangement is coupled to the edge ring to provide second RF power to the edge ring. The second RF power being delivered to the edge ring has a frequency of about 20 KHz to about 10 MHz, resulting in the edge ring having an edge ring potential. The method further includes generating a plasma within the plasma processing chamber to process the substrate. The substrate is being processed while the edge ring RF voltage control arrangement is configured to cause the edge ring potential to be substantially equal to a DC potential of the substrate while processing the substrate.

The above summary relates to only one of the many embodiments of the invention disclosed herein and is not intended to limit the scope of the invention, which is set forth in the claims herein. These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENTS

Figure 1:
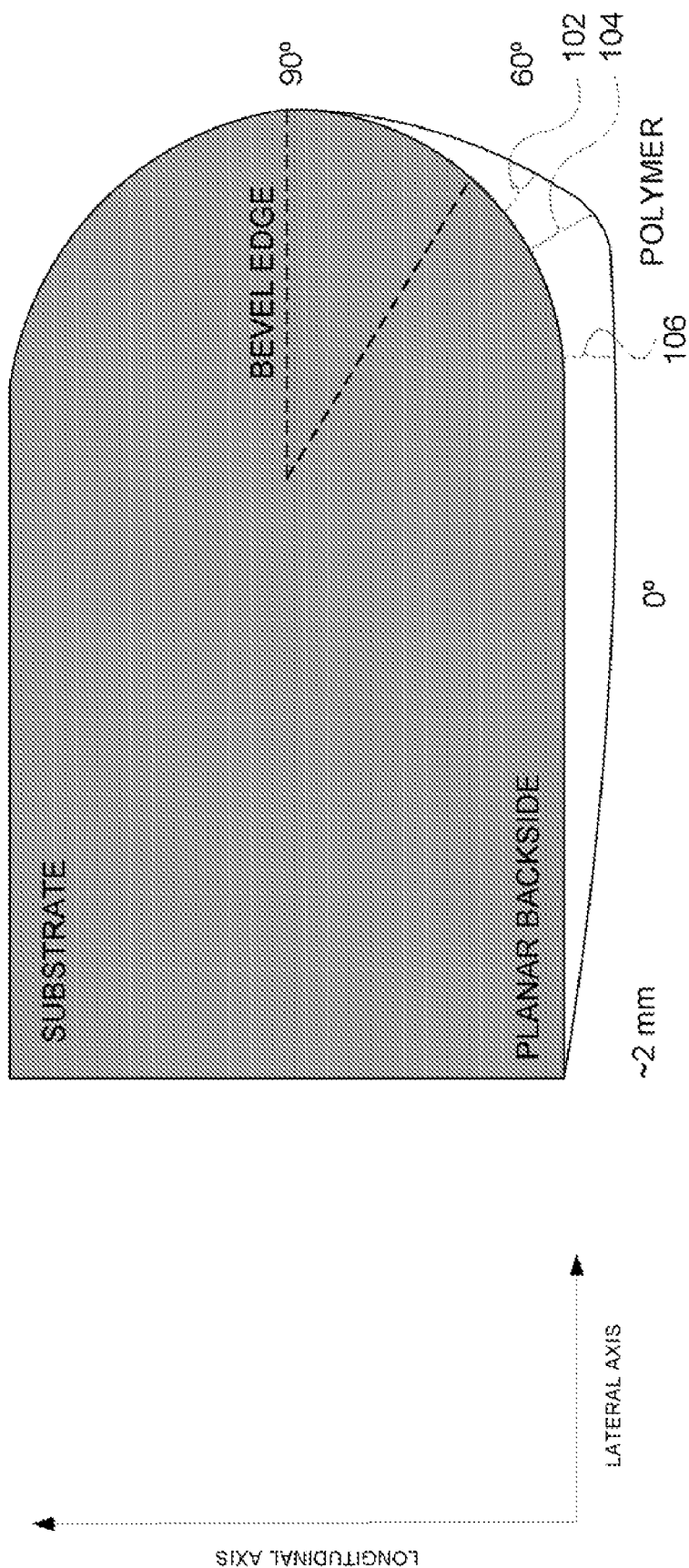
FIG. 1 shows a simplified diagram of a substrate in which a set of edge polymers have been deposited on the planar backside is shown.
Figure 2:
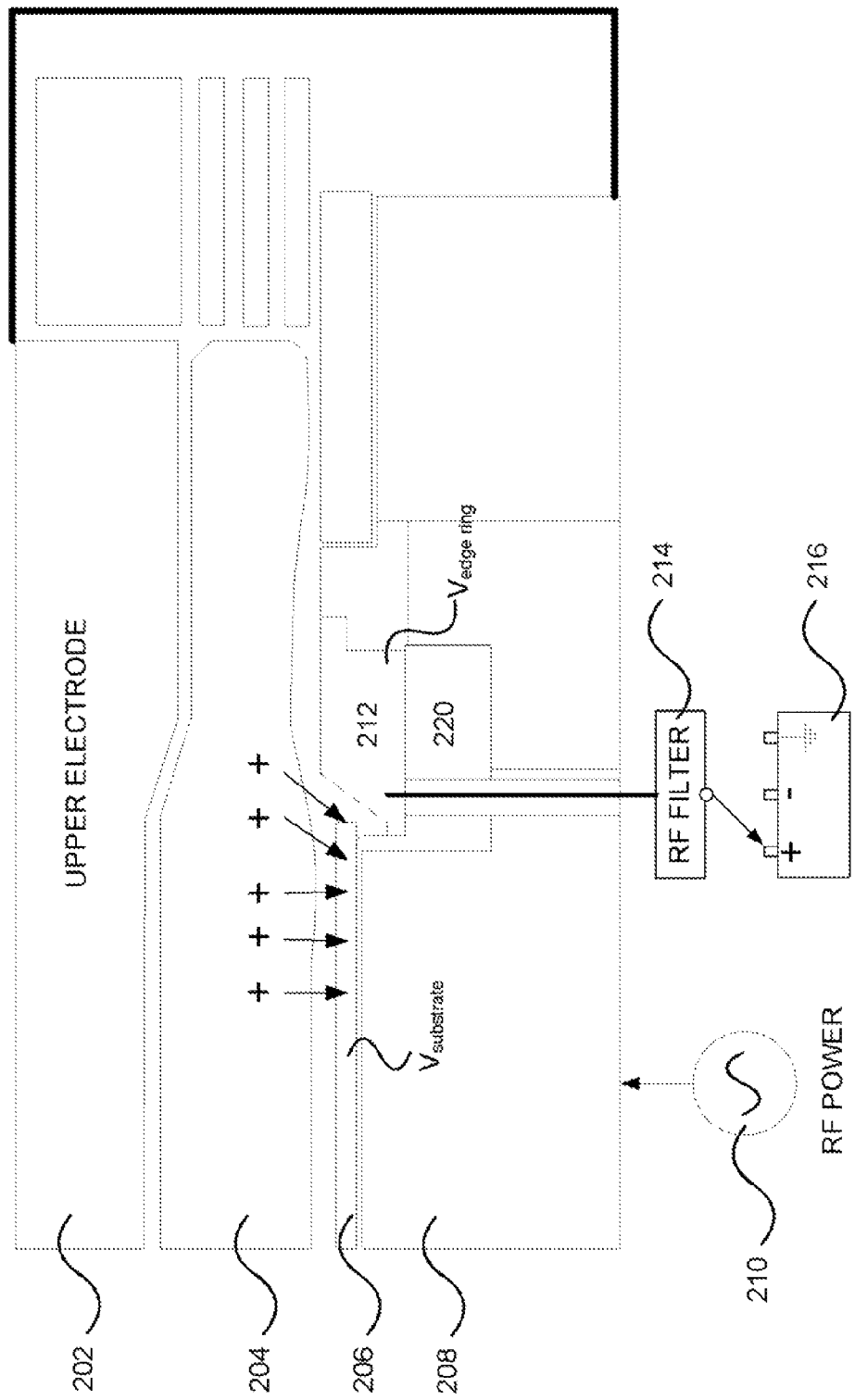
FIG. 2 shows a simplified diagram of a capacitively-coupled plasma processing system in which the DC potential of the edge ring is substantially greater than that of the substrate.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described hereinbelow, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

In accordance with embodiments of the invention, there are provided methods and arrangements for configuring a plasma processing system to enhance control over plasma processing parameters. Embodiments of the invention include delivering a low frequency RF power to an HER to produce desired electric potential differences between a substrate and an edge ring. Thus, the equipotential lines of the plasma sheath for a given plasma process may be optimized.

In one or more embodiments of the invention, an independent low frequency RF power source and an RF match network may be employed to deliver RF power to an HER through an RF filter. Embodiments of the invention enable the independent control of an area of RF sheath voltage above a substrate edge ring with respect to an area of RF sheath voltage above a substrate to produce desired electric potential differences.

In another embodiment of the invention, low frequency RF power may be delivered to an HER from an RF power source, which normally delivers multi-frequency RF power to a substrate. In an example, a variable capacitor may be employed to control the low frequency RF power delivery to the HER. Embodiments of the invention enable control of an area of RF sheath voltage above a substrate edge ring with respect to an area of RF sheath voltage above a substrate to produce desired electric potential difference.

In one or more embodiments of the invention, an HER may be configured to have a plurality of segments. Each segment of the HER may be electrically isolated from the other segments by a plurality of insulators. Low frequency RF power may be individually controlled and delivered to each HER segment and a common RF power source. The low frequency RF power from the common RF power source may be individually controlled by a plurality of variable device. Embodiments of the invention enable individually controlling the amount of RF power being delivered to each segment of the HER to improve azimuthal uniformity of plasma species around the substrate edge.

In one or more embodiments of the invention, one or more additional controls may be employed to provide an integrated solution for improving the uniformity of a substrate during plasma processing. In an embodiment, differential gas flow may be employed to compensate for the differential of plasma species and chemistry that may be caused by abrupt change from the substrate to an HER. In another embodiment electrostatic clamping of the HER to a bottom electrode may be employed to individually control the temperature of the HER. In yet another embodiment, external DC control may be employed to control $V_{DC}$ on HER.

Figure 3:
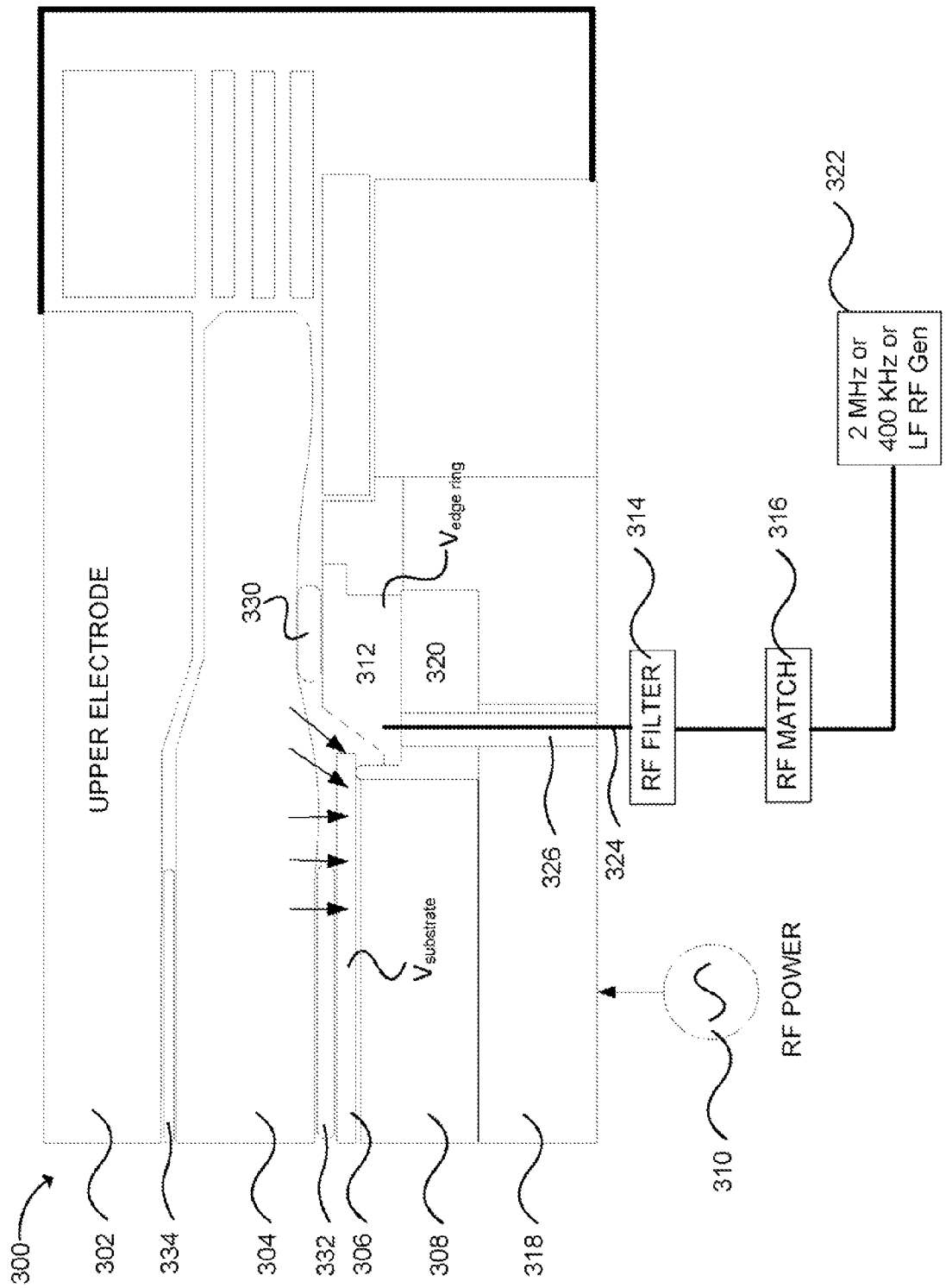
FIG. 3 shows, in accordance with an embodiment of the present invention, a simplified schematic of a capacitively-coupled plasma processing system with independent low frequency (LF) RF voltage control arrangement.

The features and advantages of the invention may be better understood with reference to the figures and discussions that follow. FIG. 3 shows, in accordance with an embodiment of the present invention, a simplified schematic of a capacitively-coupled plasma processing system 300 with independent low frequency (LF) RF voltage control arrangement.

Plasma processing system 300 may be a single, double, or triple frequency RF capacitively discharge system. In an example, radio frequencies may include, but are not limited to, e.g., 2 MHz, 27 MHz, and 60 MHz. Plasma processing system 300 may be configured to include a substrate 306 being disposed above an electrostatic chuck (ESC) 308. ESC 308, which also serves as a powered electrode, is disposed above a lower electrode 318.

Consider the situation wherein, for example, substrate 306 is being processed. During plasma processing, a multifrequency RF generator 310 with a path to ground (not shown to simplify the figure) may supply low RF bias power to lower electrode 318 through an RF match network (not shown to simplify the figure). The RF power provided from RF generator 310 may interact with a gas (not shown to simplify the figure) to ignite plasma 304 between upper electrode 302 and substrate 306. Plasma may be employed to etch and/or deposit materials onto substrate 306 to create electronic devices.

In the implementation of FIG. 3, certain etch applications may require upper electrode 302 to be grounded with respect to a lower electrode, which is RF powered. The RF power is at least one of 2 MHz, 27 MHz, and 60 MHz. Still other etch applications may require both the upper electrode and the lower electrode to be RF powered using similar RF frequencies.

As shown in FIG. 3, hot edge ring (HER) 312 generally performs many functions, including positioning substrate 306 on ESC 308 and shielding the underlying components not protected by the substrate itself from being damaged by the ions of the plasma. Hot edge ring 312 may further sit on a coupling ring 320 (e.g., quartz, etc.).

In the prior art, a configurable DC power source may be coupled to hot edge ring through an RF filter. Unlike prior art methods, an independent low frequency RF power source 322 and an RF match network 316 may be employed to deliver RF power to HER 312 through an RF filter 314 in accordance with an embodiment of the invention. In an example, RF match network 316 may be employed to maximize RF power delivery to HER 312. In an embodiment, low frequency RF power may be delivered to HER 312 via a coaxial cable 324 enclosed in an insulator sleeve 326. As shown in FIG. 3, RF filter 314 is generally used to provide attenuation of unwanted RF power without introducing losses to low frequency (about 20 KHz to about 10 MHz) RF power source 322. Harmonics are generated in the plasma discharge and may be kept from being returned to low frequency RF power source 322 by RF filter 314.

To prevent RF coupling to substrate 306, the frequency of the low frequency RF power source being delivered to HER 312 may be different, in an embodiment, from the frequency being delivered to the bias electrode, e.g. ESC 308. By decoupling from substrate 306, the low frequency RF power source being supplied to HER 312 goes mainly into independently controlling the induced $V_{DC}$ on HER 312, and not the voltage or ion energy to substrate 306.

In employing low frequency RF power source to control $V_{DC}$ on HER 312, the power usage may be relatively low compared to high frequency RF power source. Since high RF frequency may tend to couple to plasma, the power usage for employing high frequency RF power to control voltage may be higher to achieve the same $V_{DC}$ control on HER 312. Analogously, prior art solutions employing configurable DC power source to control voltage on HER 312 may also require more power to achieve the same $V_{DC}$ control on HER 312. Advantageously, low frequency RF power allows for easier RF match resulting in coverage for the whole range of the process window.

In the implementation of FIG. 3, low frequency RF power source 332, which is being delivered to HER 312, may allow for independent control of an area of RF sheath voltage above the substrate edge ring 330 with respect to an area of RF sheath voltage above the substrate 332 to produce desired electric potential differences in accordance with an embodiment. Hence, the chemistry and/or plasma around substrate 306 edge are not affected.

While not wishing to be bound by theory, the inventor believes that the ion angular distribution may be controlled by altering the DC potential between the substrate and the edge ring, thus optimizing the equipotential lines of the plasma sheath for a given plasma process. In an advantageous manner, changes may be made to the electric field around the substrate edge by changing an RF coupling of an edge ring. In an embodiment, the chuck is substantially electrically isolated from the edge ring.

For example, if the DC potential of the substrate edge is substantially the same as the DC potential of the edge ring (e.g., $V_{substrate} - V_{edge\ ring} \approx 0$), the ion angular distribution is generally uniform. Consequently, in an area of the plasma sheath above both the substrate and the edge ring, a set of ion vectors are formed that are substantially perpendicular to the substrate.

However, if the DC potential of the substrate edge is substantially different from the DC potential of the edge ring, the ion angular distribution is generally non-uniform. Consequently, in the area of the plasma sheath above both the substrate and the edge ring, a set of ion vectors are formed that tend to be non-uniform with respect to the surfaces of the substrate and the edge ring.

In an advantageous fashion, the DC potential on the edge ring may be independently controlled from that of the substrate. Consequently, the difference between the DC potential of the substrate to the DC potential of the edge ring may be optimized in order to control the angular distribution of the positively charged ions in the plasma around the edge of the substrate.

Figure 4:
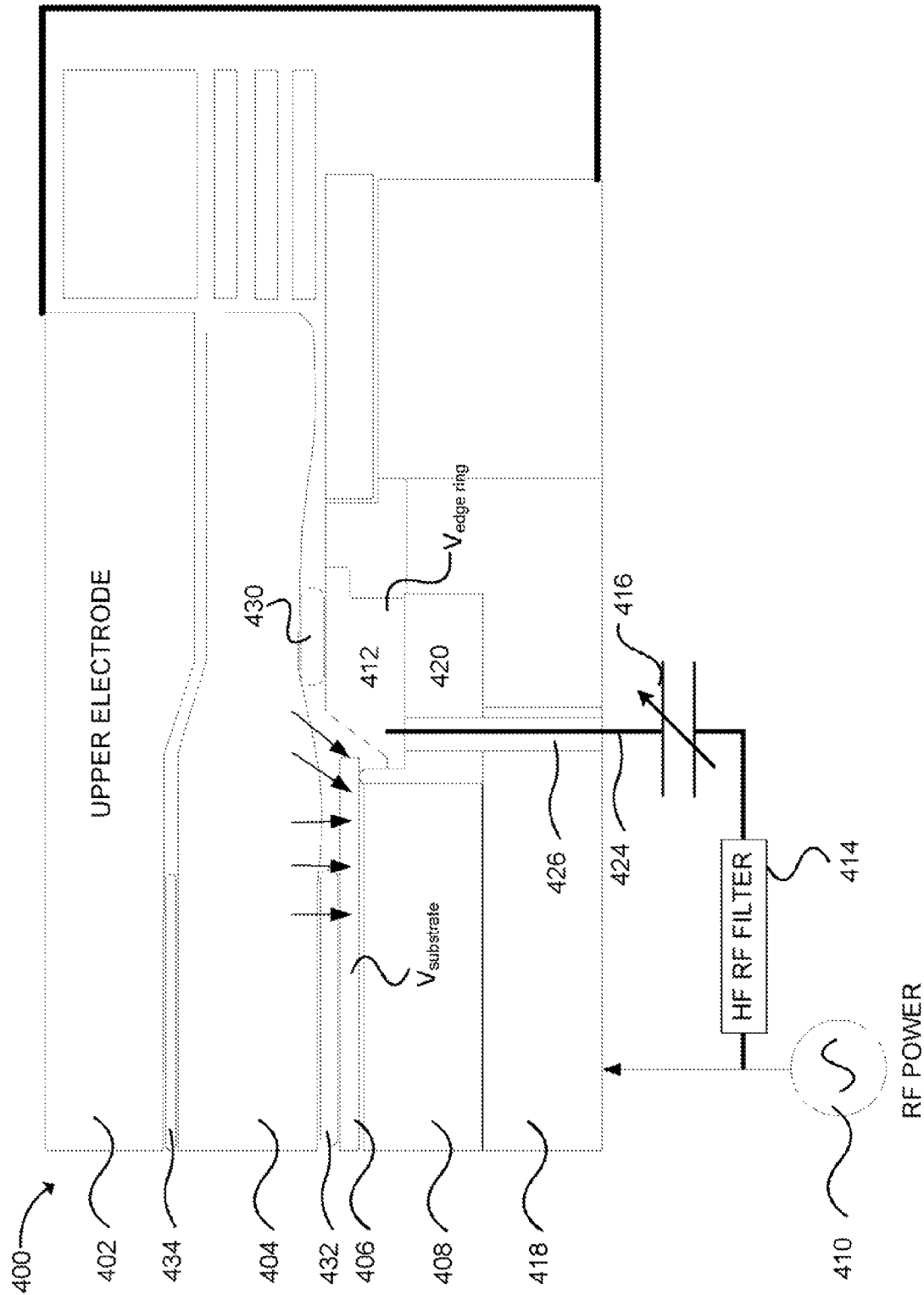
FIG. 4 shows, in accordance with an embodiment of the invention, a multi-frequency capacitively coupled plasma processing system with low frequency RF from RF generator.

In addition to the aforementioned method and arrangement as discussed in FIG. 3, other embodiments may be provided in which low frequency wafer/substrate RF power may be employed to deliver RF power to HER to control RF sheath voltage. FIG. 4 shows, in accordance with an embodiment of the invention, a multi-frequency capacitively coupled plasma processing system 400 with low frequency RF from RF generator 410. Plasma processing system 400 may be configured to include a grounded upper electrode 402, a substrate 406, an electrostatic chuck (ESC) 408, a lower electrode 418, a hot edge ring (HER) 412, a coaxial cable 424, and an insulator sleeve 426.

Consider the situation wherein, for example, substrate 406 is being processed. Plasma 404 may be struck when gas (not shown to simply the figure) interacts with RF power from RF power generator 410. Plasma 404 may be employed to etch and/or deposit materials onto substrate 406 to create electronic devices.

As aforementioned, substrate edge effects, such as electric field, plasma temperature, and the loading effects from process chemistry, may cause the process results near the substrate edge to be differed from the remaining (center) area of the substrate. For example, the equipotential lines of the plasma sheath may become disrupted, causing non-uniform ion angular distribution around the substrate edge.

In an embodiment, RF power source 410, which generally delivers RF power to substrate 406, may be employed to deliver low frequency RF power to HER 412 through a high frequency RF filter 414 and a variable capacitor 416. In an example, variable capacitor 416 may be employed to control low frequency RF power delivery to HER 412 in accordance with an embodiment of the invention. Due to the low frequency, RF power from RF generator 410 may be delivered to HER 412 via coaxial cable 424 enclosed in insulator sleeve 426 in an embodiment.

In the implementation of FIG. 4, low frequency RF power source 410, which is being coupled to HER 412, may allow for limited control of an area of RF sheath voltage above the substrate edge ring 430 with respect to an area of RF sheath voltage above the substrate 432 to produce desired electric potential difference in accordance with an embodiment of the invention. The limited control may be due to RF power to both substrate 406 and/or HER 412 being from the same RF generator 410.

Although HER 412 voltage may be controlled by controlling the ratio of RF power to substrate 406 and HER 412, the RF power to substrate 406 may drop if more RF power is shifted to HER 412. Notwithstanding the lack of independent control of RF power to substrates 406 and/or HER 412, the trade-off in not employing an independent RF power source may be offset by providing device manufacturer(s) the ability to control induced DC voltage on HER 412 through low frequency RF power from multi-frequency RF power source 410 to improve etching rate uniformity.

While not wishing to be bound by theory, the inventor believes that the ion bombardment to substrate may be controlled by altering the sheath thickness. Consider the situation wherein, for example, low frequency RF power may be supplied to the HER resulting in increasing the sheath thickness and impedance. The voltage drop is a combination of the voltage drop across the sheath and the voltage drop across the surface on top of the substrate. Due to the higher voltage drop across a thicker sheath, i.e., higher impedance, ion bombardments to the substrate may be less. In an embodiment, the sheath thickness may be controlled by adjusting the voltage on the HER through low frequency RF power to affect ion bombardment on the substrate.

Another indirect effect from applying low frequency RF power to the HER is the DC-like effect similar to applying DC to the upper electrode. For example, the power of low RF may be increased to cause the induced $V_{DC}$ on the HER to increase. As a result, there is a higher voltage drop on the upper electrode causing secondary electrons to be ejected into the plasma increasing the plasma density. Hence, the plasma density may be controlled by the voltage on the HER through low frequency RF power.

In general, low frequency RF power is easier to deliver and control than high frequency RF power. In the implementation of FIGS. 3 and 4, low frequency RF power may be delivered to the HER by inexpensive coaxial cable in an embodiment. In prior art, when high frequency RF power is being supply to a localized spot on the HER, the azimuthal uniformity of plasma species around the wafer edge may be low due to the localized effect from the high frequency RF power on the HER. In high frequency RF power, the energy from high frequency RF power may couple to the plasma species. In contrast, the azimuthal uniformity around the wafer edge is high since low frequency RF power may not create localized effect on the HER. The low frequency RF power affects the voltage at the HER without coupling to the plasma species. As the term is employed herein, azimuthal refers to the horizontal component of direction, e.g., compass direction, as being measured around the horizon.

Figure 5:
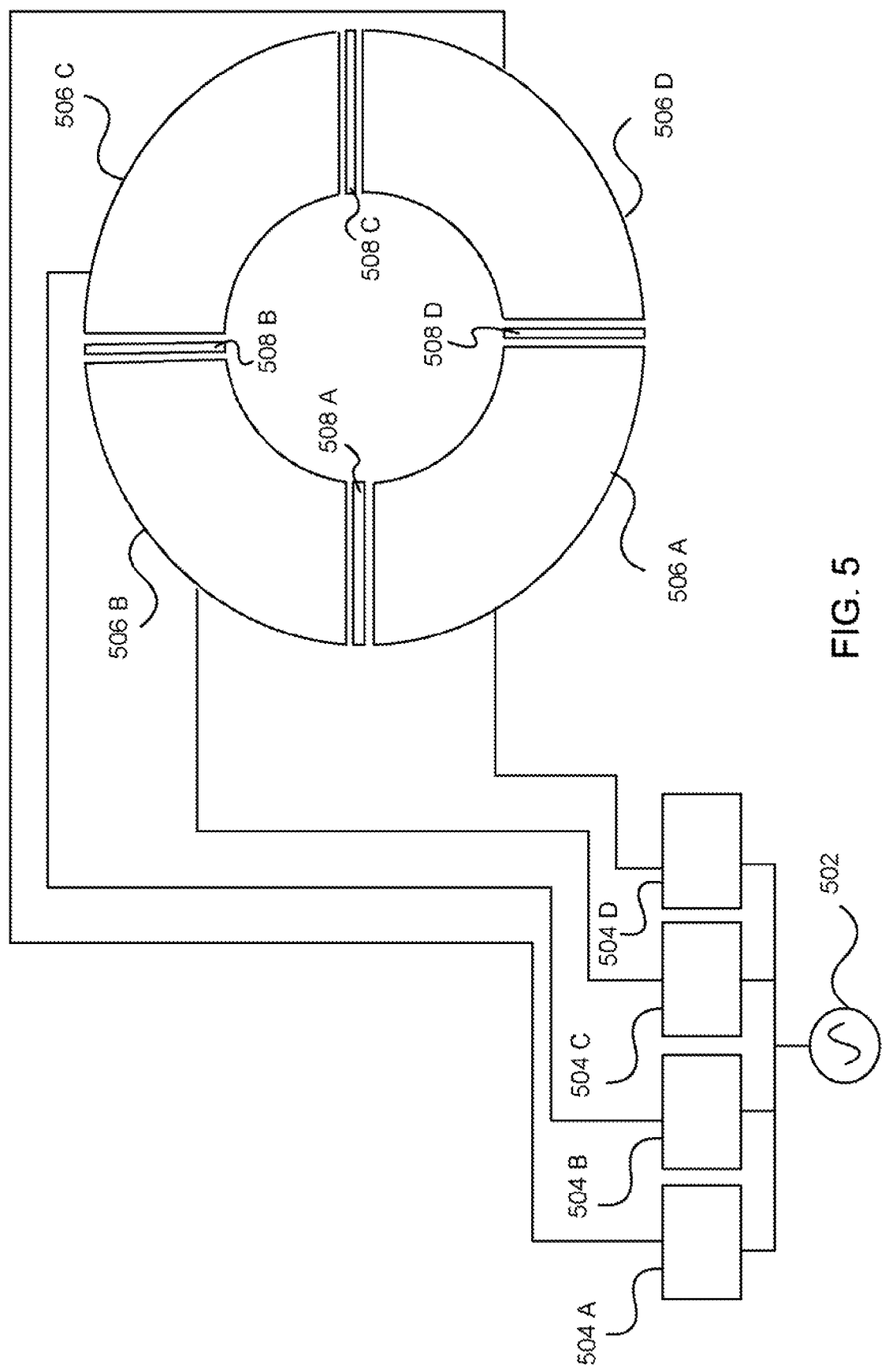
FIG. 5 shows, in accordance with an embodiment of the invention, a simplified schematic of a segmented HER and arrangements for low frequency RF power delivery to each segment.

When low frequency RF power delivery to the HER, the azimuthal uniformity may be high. The azimuthal uniformity of plasma species around the wafer edge may be improved by segmenting the low frequency RF power delivery to the HER. FIG. 5 shows, in accordance with an embodiment of the invention, a simplified schematic of a segmented HER and arrangements for low frequency RF power delivery to each segment.

In the implementation of FIG. 5, an HER may be divided into a plurality of segments (506A, 506B, 506C and 506D) in an embodiment. Each HER segment may be electrically isolated from the other by a plurality of insulators (508A, 508B, 508C, and 508D) in accordance with an embodiment of the invention. In an embodiment, low frequency RF power may be individually controlled and delivered to each HER segment. In an embodiment, for example, the low frequency RF power may be delivered from a common RF power source 502. The low frequency RF power from the common RF power source 502 may be individually controlled by a plurality of variable devices (504A, 504B, 504C, and 504D) to each HER segment in accordance with an embodiment of the invention. These variable devices may be implemented by variable matches, for example. The variable devices may be employed to provide independent control of the delivery of the low frequency RF power to an HER segment.

Consider the situation wherein, for example, during plasma processing, there may be azimuthal non-uniformity on the HER at segment 506C. The low frequency RF power may be adjusted locally by adjusting variable device 504B to control the amount of RF power being delivered to HER segment 506C from common RF power source 502. Thus, azimuthal uniformity of plasma species around the wafer edge may be improved by individually controlling the amount of RF power being delivered to each segment of a hot edge ring. In contrast to prior art where localized effect of RF power delivery on an HER may cause azimuthal non-uniformity, controlled delivery of RF power to a segment of an HER may provide for better azimuthal uniformity around the wafer edge.

Figure 6:
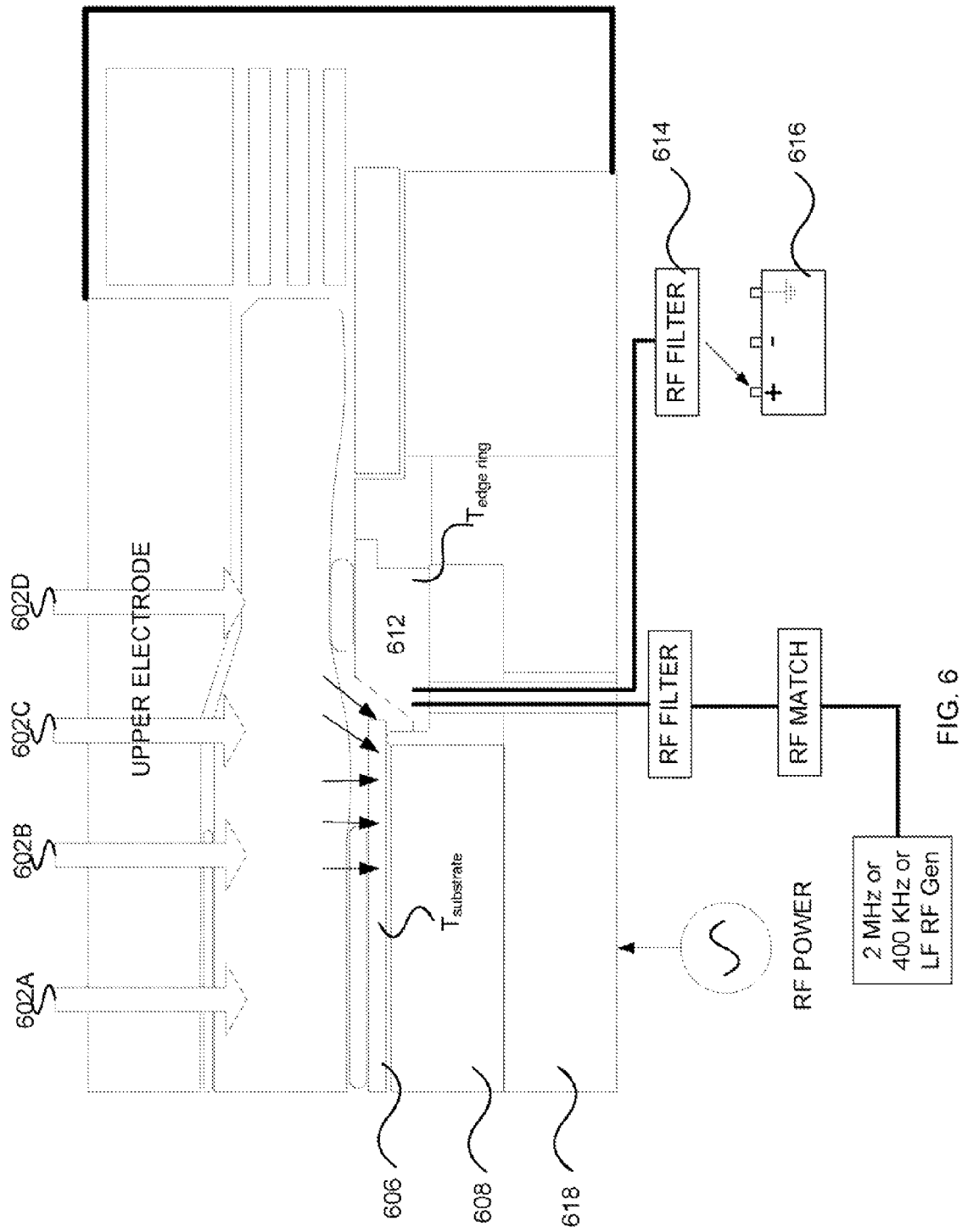
FIG. 6 shows, in accordance with an embodiment of the invention, a simplified schematic to conceptually show an integrated solution with additional localized gas flow, temperature, and/or external DC power source controls.

Once voltage control to HER is achieved by low frequency RF power, one or more additional controls may be introduced to provide an integrated solution for improved uniformity of substrate during plasma processing in accordance with one or more embodiments of the invention. FIG. 6 shows, in accordance with an embodiment of the invention, a simplified schematic to conceptually show an integrated solution with additional localized gas flow, temperature, and/or external DC power source controls.

Consider the situation wherein, for example, low frequency RF power may be delivered to an HER 612 during plasma processing to correct sheath voltage and/or ions trajectory issues. The chemistry around the wafer edge may be affected due to the sputtering of the HER materials. The by-products from the sputtered HER materials may interact and interfere with the local etching chemistry at the wafer edge adjacent to the HER.

In the example of FIG. 6, differential gas flow may be introduced through a plurality of nozzles (602A, 602B, 602C, and 602D) across the region that may include a substrate 606 and an HER 612 to provide different etch gas densities in an embodiment. Therefore, different plasma species may exist in different regions across substrate 606 and HER 612 to compensate for the differential of the plasma species and the chemistry caused by abrupt change from substrate 606 to HER 612.

Conceptually, to get differential gas flow across substrate 606 and/or HER 612, the first gas flow rate from first nozzle 602A may be different from second flow rate from second nozzle 602B, and the like in accordance with an embodiment. The gas flow rate through each nozzle may be actively manipulated using appropriate flow control strategy and flow control mechanism (e.g., mass flow controller). Hence, plasma density may be controlled individually to offset the chemistry effect cause by unwanted sputtering of HER materials from RF voltage control of HER 612.

In general, the temperature of wafer edge of substrate 606 and/or HER 612, e.g., $T_{substrate}$ and/or $T_{edge\ ring}$, may increase during plasma processing. Uncontrolled increases in temperature at HER 612 may adversely affect wafer edge results. For example, as HER 612 gets hotter, the chemistry and reactivity of plasma species of the wafer edge in the local vicinity of HER 612 may change. The inventors herein realize the temperature of substrate 606 and/or HER 612 need to be individually controlled to maintain process uniformity during plasma processing.

In an embodiment, the temperature of substrate 606 may be controlled by electrostatically clamping substrate 606 to chuck (ESC) 608. Analogously, the temperature of HER 612 may be individually controlled by also employing electrostatic clamping of HER 612 to bottom electrode 618 in an embodiment. By clamping the heat transfer mechanism, the temperature of HER 612 transfers heat from bottom electrode 618 onto HER 612. Thus, by employing electrostatic forces to clamp substrate 606 or HER 612, $T_{substrate}$ and/or $T_{edge\ ring}$ may be individually controlled to allow etching to occur at an appropriate rate.

Consider the situation wherein, for example, DC voltage may be manipulated by an external DC power supply 616 through an RF filter 614 while applying low frequency RF power to HER 612. In an example, the DC may be grounded while applying low frequency RF power to HER 612. In another example, the DC voltage, i.e. positive or negative $V_{CD}$, may be applied while applying low frequency RF power to HER 612.

When low frequency RF power is being applied to HER 612 during plasma processing, a $V_{DC}$ may be induced on HER 612 to push plasma potential higher. In order to force VDC on HER 612 to remain at zero, plasma potential may tend to shift affecting the ion energy on substrate 606. By having external DC control on HER 612 while applying low frequency RF power to HER 612, the ion energy on substrate 606 may be controlled independently.

In general, device fabrication tends to be a multi-steps process. Each step in a process recipe for plasma processing of a substrate may have unique process parameters. For example, the process recipe for an etching step may specify a low frequency RF power to be directed to an HER to control plasma sheath to get better uniformity at a substrate edge in an embodiment. However, if the low frequency RF power is not being applied to the HER during plasma processing, ions tend to bombard the backside of a substrate edge, i.e. beveled edge, due to the voltage potential difference between the HER and the substrate. As ions bombard the beveled edge, polymer deposits on the beveled edge may be removed through the ion bombardments. Hence, an in-situ process step for cleaning the beveled edge of the substrate may be achieved. For example, the process recipe for an in-situ cleaning step may specify that the low frequency RF power to be turned off to allow the ions to bombard the beveled edge in an embodiment.

As may be appreciated from the foregoing, embodiments of the invention provide methods and arrangements for control of wafer edge results by controlling sheath voltages on HER around the wafer edge. By employing an integrated solution of tuning gas and/or electrostatic clamping for thermal control with low RF HER voltage control (these approaches may be employed singularly or in any combination and/or sequence), the plasma processing of wafer edge results may be controlled locally to achieve higher yield of devices being fabricated By employing external DC control with low RF HER voltage control, the ion energy on the substrate may be controlled independently. By controlling HER voltage in different steps of a process recipe, an in-situ cleaning of polymer deposition is possible on the beveled edges. In addition, several indirect results that indicate ion energy and plasma density may be controlled during plasma processing.

While this invention has been described in terms of several preferred embodiments, there are alterations, permutations, and equivalents, which fall within the scope of this invention. Also, the title, summary, and abstract are provided herein for convenience and should not be used to construe the scope of the claims herein. It should also be noted that there are many alternative ways of implementing the methods and apparatuses of the present invention. Although various examples are provided herein, it is intended that these examples be illustrative and not limiting with respect to the invention. Further, in this application, a set of "n" items refers zero or more items in the set. It is therefore intended that the following appended claims be interpreted as including all such alterations, permutations, and equivalents as fall within the true spirit and scope of the present invention.

What is claimed is:

1. In a plasma processing chamber, a method for processing a substrate, said substrate being disposed above a chuck and surrounded by an edge ring, said edge ring being electrically isolated from said chuck, comprising:

providing first RF power to said chuck;

providing an edge ring RF voltage control arrangement, said edge ring RF voltage control arrangement being coupled to said edge ring to provide second RF power to said edge ring, said second RF power being delivered to said edge ring has a frequency of about 20 KHz to about 10 MHz, resulting in said edge ring having an edge ring potential; and generating a plasma within said plasma processing chamber to process said substrate, said substrate being processed while said edge ring RF voltage control arrangement is configured to cause said edge ring potential to be substantially equal to a DC potential of said substrate while processing said substrate.

2. The method of claim 1, wherein said edge ring RF voltage control arrangement includes an RF filter arrangement and an RF match arrangement, said RF filter arrangement being disposed between said edge ring and an RF power source.

3. The method of claim 2, wherein said RF filter arrangement is configured to attenuate unwanted harmonic RF energy from reaching said RF power source.

4. The method of claim 2, wherein said RF match arrangement is configured to maximize RF power delivery to said edge ring.

5. The method of claim 1, wherein said RF power source is an RF generator that is different from an RF generator employed to provide said first RF power to said chuck.

6. The method of claim 1, wherein said RF power source is an RF generator that is also employed to provide said first RF power to said chuck.

7. The method of claim 1, wherein the frequency of said second RF power being delivered to said edge ring is different from the frequency of said first RF power.

8. The method of claim 7, wherein said first RF power being delivered to said chuck has a frequency of about 2 MHz.

9. The method of claim 7, wherein said first RF power being delivered to said chuck has a frequency of about 27 MHz.

10. The method of claim 7, wherein said first RF power being delivered to said chuck has a frequency of about 60 MHz.

11. The method of claim 1, wherein said edge ring is electrically decoupled from said substrate.

12. The method of claim 1, wherein said edge ring is a monolithic unit.

13. The method of claim 1, wherein said edge ring is configured to include a plurality of segments.

14. The method of claim 13, wherein a segment of said plurality of segments of said edge ring is configured to be electrically isolated from adjacent segments of said plurality of segments of said edge ring.

15. The method of claim 14, wherein at least two segments of said plurality of segments of said edge ring are configured to have independent control of said second RF power delivered to each of said at least two segments of said plurality of segments.

16. The method of claim 1 further comprising:
generating differential gas flow across a region, said region includes said substrate and said edge ring, said differential gas flow is provided by a plurality of nozzles;
providing electrostatic clamping means to said edge ring to independently control temperature of said edge ring; and
providing external DC voltage control arrangement to provide DC power to said edge ring.

17. A plasma processing system having a plasma processing chamber configured for processing a substrate, said substrate being disposed above a chuck and surrounded by an edge ring, said edge ring being electrically isolated from said chuck, comprising:

a first RF power is provided to said chuck; and
an edge ring RF voltage control arrangement, said edge ring RF voltage control arrangement being coupled to said edge ring to provide second RF power to said edge ring, said second RF power being delivered to said edge ring has a frequency of about 20 KHz to about 10 MHz, resulting in said edge ring having an edge ring potential, said plasma processing chamber is configured to strike plasma to process said substrate, said substrate being processed while said edge ring RF voltage control arrangement is configured to cause said edge ring potential to be substantially equal to a DC potential of said substrate while processing said substrate.

18. The plasma processing system of claim 17, wherein said edge ring RF voltage control arrangement includes an RF filter arrangement and an RF match arrangement, said RF filter arrangement being disposed between said edge ring and an RF power source.

19. The plasma processing system of claim 17, wherein said RF power source is an RF generator that is different from an RF generator employed to provide said first RF power to said chuck.

20. The plasma processing system of claim 17, wherein said RF power source is an RF generator that is also employed to provide said first RF power to said chuck.

21. The plasma processing system of claim 17, wherein the frequency of said second RF power being delivered to said edge ring is different from the frequency of said first RF power.

22. The plasma processing system of claim 21, wherein said first RF power being delivered to said chuck has a set of RF frequencies that includes at least one of about 2 MHz, about 27 MHz, and about 60 MHz.

23. The plasma processing system of claim 17, wherein said edge ring is electrically decoupled from said substrate.

24. The plasma processing system of claim 17, wherein said edge ring is a monolithic unit.

25. The plasma processing system of claim 17, wherein said edge ring is configured to include a plurality of segments.

26. The plasma processing system of claim 25, wherein a segment of said plurality of segments of said edge ring is configured to be electrically isolated from adjacent segments of said plurality of segments of said edge ring.

27. The plasma processing system of 26, wherein at least two segments of said plurality of segments of said edge ring are configured to have independent control of said second RF power delivered to each of said at least two segments of said plurality of segments.

28. The plasma processing system of claim 17 further comprising:
differential gas flow is configured to flow across a region, said region includes said substrate and said edge ring, said differential gas flow is provided by a plurality of nozzles;
electrostatic clamping means is configured to provide said edge ring independent temperature control of said edge ring; and
external DC voltage control arrangement is configured to provide DC power to said edge ring.

* * * * *